(12) United States Patent
Sota

(10) Patent No.: US 7,876,572 B2
(45) Date of Patent: Jan. 25, 2011

(54) WIRING BOARD AND SEMICONDUCTOR APPARATUS

(75) Inventor: Yoshiki Sota, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 503 days.

(21) Appl. No.: 11/656,432

(22) Filed: Jan. 23, 2007

(65) Prior Publication Data

US 2007/0176300 A1   Aug. 2, 2007

(30) Foreign Application Priority Data

Jan. 27, 2006   (JP)   .............................. 2006-019078

(51) Int. Cl.
  H05K 7/02   (2006.01)
  H05K 7/06   (2006.01)
  H05K 7/08   (2006.01)
  H05K 7/10   (2006.01)

(52) U.S. Cl. ........................ 361/777; 361/772; 361/778; 361/779

(58) Field of Classification Search .......... 361/770–774, 361/780–784; 257/778–780
See application file for complete search history.

(56) References Cited

U.S. PATENT DOCUMENTS

| 5,874,784 | A | 2/1999 | Aoki et al. | |
|---|---|---|---|---|
| 6,285,086 | B1 | 9/2001 | Sota et al. | |
| 6,323,438 | B1 | 11/2001 | Ito | |
| 6,617,521 | B1 | 9/2003 | Saito et al. | |
| 6,777,814 | B2 * | 8/2004 | Iwasaki et al. | ............... 257/778 |
| 7,432,580 | B2 * | 10/2008 | Sato et al. | .................... 257/516 |

FOREIGN PATENT DOCUMENTS

| JP | 8-153824 A | 6/1996 |
|---|---|---|
| JP | 9-121002 | 5/1997 |
| JP | 10-214914 A | 8/1998 |
| JP | 11-354676 A | 12/1999 |
| JP | 2001-15628 | 1/2001 |
| JP | 2003-7914 A | 1/2003 |
| JP | 2003-188306 A | 7/2003 |
| TW | 468363 | 12/2001 |

* cited by examiner

*Primary Examiner*—Tuan T Dinh
(74) *Attorney, Agent, or Firm*—Nixon & Vanderhye, PC

(57) ABSTRACT

A wiring board of the present invention includes a dummy wiring in a semiconductor-chip mount area on which a semiconductor chip is to be mounted. The dummy wiring is arranged in a manner such that all wiring-lines included in the dummy wiring each have a free end within the semiconductor-chip mount area. This prevents a defect due to vaporization and expansion of moisture inside a semiconductor apparatus, with a simple structure and without raising costs.

8 Claims, 4 Drawing Sheets

WIRING BOARD AND SEMICONDUCTOR APPARATUS

This Nonprovisional application claims priority under 35 U.S.C. §119(a) on Patent Application No. 019078/2006 filed in Japan on Jan. 27, 2006, the entire contents of which are hereby incorporated by reference.

FIELD OF THE TECHNOLOGY

The present technology relates to a surface-mount semiconductor apparatus including external terminals disposed in area array. The present technology also relates to a wiring board to be used in the semiconductor apparatus.

BACKGROUND OF THE TECHNOLOGY

In response to a recent movement towards downsizing of electronics devices and automation of assembly, QFP (Quad Flat Package) type and BGA (Ball Grid Array) type semiconductor apparatuses in the shape of CSP (Chip Size Package/Chip Scale Package) are widely used. As semiconductor devices included in the semiconductor apparatuses perform high-speed and highly-functional signal processing, more external terminals become necessary. In view of this circumstance, especially a BGA type semiconductor apparatus, in which external connection terminals are disposed two-dimensionally along a bottom surface of the semiconductor apparatus, is popularly employed. Such BGA type semiconductor apparatus is taught in Patent Document 1, Japanese Unexamined Patent Publication No. 121002/1997 (*Tokukaihei* 9-121002) (published on May 6, 1997), for example. In the semiconductor apparatus of Patent Document 1, a semiconductor chip, with its surface on which a circuit is formed facing upward, and the wiring board are wired by using a wire bonding method, thereby allowing the semiconductor chip to be electrically connected to external connection terminals via a wiring pattern.

FIG. 5 shows a cross section of an exemplary structure of a resin-sealing type semiconductor apparatus in the shape of BGA (BGA type semiconductor package, BGA type semiconductor apparatus). This is currently a majority of BGA type semiconductor packages. Compared with other semiconductor apparatuses, the BGA type semiconductor apparatus has an advantageous structure in view of electric properties and downsizing of semiconductor apparatuses. For this reason, the BGA type semiconductor apparatus is popularly employed in portable electronics devices such as portable phones and portable game machines.

The following describes a BGA type semiconductor apparatus 100, with reference to FIG. 5. As shown in FIG. 5, the BGA type semiconductor apparatus 100 includes, mainly, a semiconductor chip (semiconductor device) 1, a wiring board 80, a thin metal wire (wire) 7 for connecting the semiconductor chip 1 and the wiring board 80, and an external terminal 9 having conductivity. The semiconductor apparatus 100 is sealed with a resin 10. The wiring board 80 includes an insulative core substrate. A wiring pattern made of copper foil is formed on both surfaces of the core substrate. The wiring pattern on the upper surface of the wiring board 80 and the wiring pattern on the lower surface of the wiring board 80 are electrically connected via a through hole. The through hole is formed by making a vent with the use of a drill or the like and plating an interior of the vent with copper. Further, the wiring board 80 is covered by insulative solder resist, except for a terminal section for wire bonding in the wiring pattern, which terminal section is provided in the form of a circuit, and a land section in the wiring pattern, on which land section external terminals are to be formed.

As electronics devices are becoming smaller and thinner in recent years, semiconductor apparatuses to be installed in the electronics devices have been required to become smaller and thinner. This gives rise to an increasing demand for a thinner wiring board 80, which is to be used in the semiconductor apparatus 100. Specifically, an insulative core substrate with the thickness of 200 µm or below has become a majority. An insulative core substrate with the thickness of approximately 40 µm to 60 µm is also employed popularly. In the case of a wiring board including the core substrate with the thickness of approximately 40 µm to 60 µm, the thickness of the wiring board, including solder resist, is approximately 100 µm.

In the BGA type semiconductor apparatus 100, the semiconductor chip 1 is mounted on a surface of the wiring board 80 by use of an adhesive, which surface is opposite to a surface on which a circuit is formed. A pad section of the semiconductor chip 1 and a wire-bonding terminal section of the wiring board 80 are connected via the thin metal wire 7, which is conductive. As electronics devices are becoming highly functional in recent years, there arises a case in which a plurality of semiconductor chips 1 are placed one above the other. The thickness of the semiconductor chip 1 is generally in the range of 70 µm to 400 µm, but the thickness depends on the number of installed semiconductor chip 1. To adhere the semiconductor chip 1, an adhesive such as silver paste, insulation paste, and sheet adhesive is used. In recent years, sheet adhesives are popularly used in order to improve adhesiveness between the semiconductor chip 1 and the wiring board 80. A sheet adhesive is supplied either by adhering it in advance either to the semiconductor-chip mount area of the wiring board 80 or to a rear surface of the semiconductor chip 1. One way of applying the sheet adhesive to the rear surface of the semiconductor chip 1 is that the sheet adhesive is adhered to a rear surface of a wafer, and then the wafer with the sheet adhesive are diced into chips. Another way of applying the sheet adhesive is to transfer an adhesive component of a dicing sheet to the rear surface of the semiconductor chip 1.

The thin metal wire 7 for electrically connecting the semiconductor chip 1 and the wiring board 80 is made of a material such as gold and copper. Specifically, a gold wire with a cross-sectional diameter of approximately 20 µm to 30 µm is popularly employed currently.

In the semiconductor apparatus 100, the semiconductor chip 1 and the thin metal wire 7 are sealed with the resin 10 in such a way as to be covered by the resin 10. The sealing is performed by, for example, a transfer molding method using resin. A thermally-curable epoxy or biphenyl resin is popularly used as the resin 10 for sealing.

Furthermore, in the semiconductor apparatus 100, the external terminal 9, which is made of a metal, such as a solder ball is bonded to an opposite surface of the wiring board 80 by reflowing. The diameter of the solder ball differs depending on a pitch of the external terminal, for example. A material of solder of such solder ball has been shifted recently from a eutectic solder to a lead-free solder in view of environment protection. The lead-free solder is higher in melting point than the eutectic solder. Thus, bonding the lead-free solder requires a higher temperature than bonding the eutectic solder. Further, there is also a solder-ball terminal having a metal ball, such as copper, or a resin ball, such as resin, at the center thereof, in order to keep a clearance between the semiconductor apparatus and a mount board when the semiconductor apparatus is mounted on the mount board.

The foregoing describes a structure of the BGA type semiconductor apparatus. There is also a semiconductor apparatus called CSP, relatively similar in dimension to a semiconductor chip, that has the above structure. There is also a semiconductor apparatus having an external terminal formed without using a metal ball such as solder. Instead, a solder paste or the like is applied and then melted so as to form an external terminal of 0.1 mm or below. Another semiconductor apparatus is an LGA (Land Grid Array) type semiconductor apparatus in which no solder is provided to a metal land of a board.

To mount such semiconductor apparatuses on a mount board, the following method is commonly used. First, a solder paste or a flux is applied to the mount board. Then, a semiconductor apparatus (package) is placed thereon. Thereafter, an external terminal made of a solder is melted by use of a heating machine such as a reflow oven, thereby connecting the semiconductor apparatus to the mount board. As described above, a solder material that is a component of the external terminal has been shifted in recent years from the eutectic solder to the lead-free solder in view of environment protection. For this reason, the temperature of the heat to be applied in mounting the semiconductor apparatus on the mount board tends to increase. Specifically, change in the solder material from the eutectic solder to the lead-free solder causes a reflowing temperature in mounting the semiconductor apparatus on the board to increase by approximately 20 degrees to 30 degrees.

As described above, to form the external terminal in producing the BGA type semiconductor apparatus, the following method is popularly employed. Specifically, the solder to be used as the external terminal is melted by use of a heating oven such as a reflow oven. Further, as also described above, to mount the semiconductor apparatus in the shape of a package such as BGA and LGA on the mount board, it is common to melt the solder and other components together in a heating oven such as a reflow oven. As the solder has been shifted in recent years from the eutectic solder to the lead-free solder in view of environment protection, the temperature of the heat to be applied in the heating oven tends to increase.

Accordingly, the semiconductor apparatus is required to be reliable enough not to cause a defect due to applied heat. A concrete defect due to applied heat is shown in the lower diagram of FIG. 5. Specifically, applied heat causes expansion of moisture absorbed by the semiconductor apparatus (semiconductor package). As a result, the inside of the package expands, causing the defect. In a semiconductor apparatus in which a semiconductor chip is placed on a wiring board and sealed with resin, moisture that is absorbed after assembly is completed tends to accumulate, with the center at an area where the semiconductor chip and the wiring board are bonded together, in the vicinity of interfaces of the components. The moisture tends to accumulate especially in an interface area of the semiconductor chip and the wiring board. For this reason, a most frequently-caused defect is expansion of a part, under a semiconductor-chip mount section, of the wiring board due to heat of a reflow oven, which heat is applied in order to mount the semiconductor apparatus (semiconductor package) on the mount board or in order to mount the solder ball. This occurs more in semiconductor apparatuses using a thin wiring board. If the wiring pattern includes a closed area under the semiconductor-chip mount section, the expansion of the board that occurs in the above situation is likely to originate in the closed portion.

As the foregoing describes, expansion of moisture having been absorbed inside causes defects, such as change in outer shape of the semiconductor apparatus, which change causes the semiconductor apparatus to become a defective or to become no longer attachable, and disconnection of a wiring inside. It is thus demanded that no such defect is produced in the semiconductor apparatus.

This tendency of expansion in the semiconductor-chip mount area of the wiring board increases especially in the semiconductor apparatuses (semiconductor packages) having a thin wiring board. This is an obstacle to making the semiconductor apparatuses thinner and smaller.

To solve this problem, for example Patent Document 2, Japanese Unexamined Patent Publication No. 15628/2001 (published on Jan. 19, 2001) teaches a semiconductor apparatus 101 shown in FIG. 6. In the semiconductor apparatus 101, a vent (vent hole) 11 for releasing the air is made through a part, within the semiconductor-chip mount area 20, of the wiring board so as to allow moisture accumulated inside the package to escape.

However, the semiconductor apparatus 101 having the vent 11 for allowing moisture accumulated inside the package to escape requires a space in the wiring board 81 for the vent 11 to be provided. This gives a restriction in layout of a wiring that is necessary to function as a device. To enable mass production of the semiconductor apparatus 101 under the current situation, a margin is necessary between the vent 11 and a neighboring wiring. Concretely, if the diameter of the vent is approximately 0.1 mm, the margin of {accuracy in position of the vent}+{distance to prevent solder resist from covering the vent}+{distance to assure the solder resist to cover the neighboring wiring} is necessary. In this case, there exists an area, with the diameter of approximately 0.3 mm, where the wiring cannot be formed. If the margin is tightly set, production cost of the wiring board 81 increases. On the other hand, if the margin is loosely set, the area where the wiring cannot be formed becomes wider.

Furthermore, a step of making the vent 11 needs to be added to the production process of the wiring board 81. This also causes an increase in production cost of the wiring board 81.

There may be a case in which metal in the semiconductor-chip mount area is arranged in solid entirely. There may be another case in which no metal pattern is formed. In these cases, however, the degree of adhesion between the semiconductor chip and the wiring board is too strong. This causes moisture in the package to accumulate in an area other than the semiconductor-chip mount area. Consequently, expansion occurs, originating in the area where the moisture has accumulated.

Meanwhile, there is another way to improve the degree of adhesion between a semiconductor chip and a wiring board in a semiconductor apparatus in which the semiconductor chip is bonded to the wiring board with the use of a sheet adhesive. Specifically, solder resist is applied for plural times so as to reduce protrusions and depressions that appear due to the wiring board, thereby lessening the influence of the protrusions and depressions of a wiring pattern thereunder. In this method, however, the step of applying solder resist is performed for plural times in producing the wiring board. This increases the number of steps in producing the wiring board, and therefore causes an increase in costs.

Further, there has been suggested another method in which, prior to assembly of a semiconductor package, accumulated moisture is removed in advance from the wiring board by heating or reducing pressure. This, however, also causes production cost or assembly cost of the wiring board to increase.

SUMMARY OF THE TECHNOLOGY

The present technology was developed is in view of the above problems, and has as an object to realize a wiring board and semiconductor apparatus with which moisture is prevented from vaporizing and expanding in the semiconductor apparatus, with a simple structure and without raising costs.

To achieve the object, a wiring board according to the present technology is adapted so that the wiring board has a first surface including a semiconductor-chip mount area on which a semiconductor chip is to be mounted and a second surface, opposite to the first surface, to which an external connection terminal is to be provided, and includes a dummy wiring, in the semiconductor-chip mount area, arranged in a manner such that a wiring line included in the dummy wiring has a free end within the semiconductor-chip mount area.

In the above arrangement, the dummy wiring is formed in the semiconductor-chip mount area in a manner such that a wiring line included in the dummy wiring has a free end within the semiconductor-chip mount area. Therefore, when a semiconductor chip is mounted on the semiconductor-chip mount area, there is no closed area formed under the semiconductor chip. If there were a closed area, moisture would be accumulated. In this case, there is no closed area. Therefore, no concentrated accumulation of moisture occurs in between the semiconductor chip and the wiring board. Thus, even when heat is applied, the defect due to expansion of moisture is prevented in the semiconductor apparatus. By providing the dummy wiring arranged in the manner described above, the defect due to expansion of moisture is prevented in the semiconductor apparatus, with a simple structure and without raising costs. Concretely, change in an outer shape of the semiconductor apparatus is prevented, which change would have caused the semiconductor apparatus to become a defective and/or become no longer attachable, and/or a wiring inside to be disconnected. Accordingly, with the wiring board arranged in a manner described above, reliable and high-quality semiconductor apparatuses are produced. Note that, if all wiring-lines included in the dummy wiring each have a free end in the semiconductor-chip mount area, the defect due to expansion of moisture is prevented more assuredly.

Additional objects, features, and strengths of the present technology will be made clear by the description below. Further, the advantages of the present technology will be evident from the following explanation in reference to the drawings.

DESCRIPTION OF THE EMBODIMENTS

Embodiment

Figure 1:
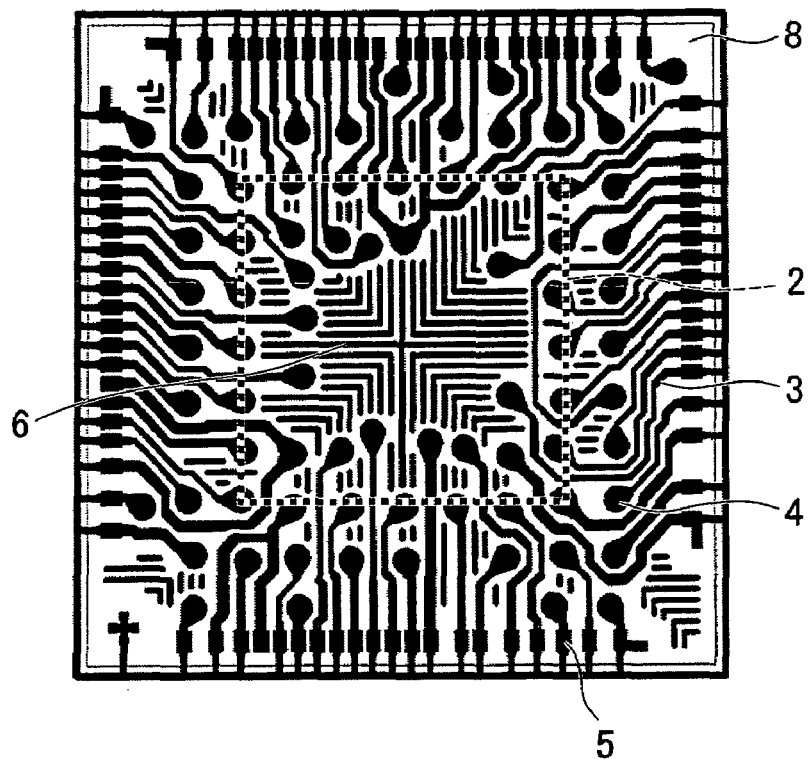
FIG. 1 is a plan view of a wiring board.

The following describes an embodiment with reference to FIGS. 1 to 4(d). In a wiring board 8 in FIG. 1, a signal wiring pattern (signal wiring) is formed on a core substrate of the wiring board 8. Further, a dummy wiring (dummy wiring pattern) 6 is formed in a semiconductor-chip mount area (mount area, area under a semiconductor chip being mounted) 2. The signal wiring pattern includes a signal wiring pattern 4, which is a metal land section to include a vent for allowing an upper surface and a lower surface of the wiring board 8 to be electrically connected, a signal wiring pattern 5, which is a connection section for wire bonding, and a signal wiring pattern 3, which connects the patterns 4 and 5. Although not shown in FIG. 1, a surface (external-connection-terminal mount surface) of the wiring board 8, which surface is opposite to a semiconductor-chip mount surface (surface including the semiconductor-chip mount area 2) of the wiring board 8, includes a signal wiring pattern that is an external-connection-terminal mount area. In the following description, the signal wiring patterns and the dummy wiring will be referred to as a wiring pattern, unless differentiation is necessary. The signal wiring pattern 4 and the external-connection-terminal mount area of the external-connection-terminal mount surface are electrically connected via a vent (not illustrated), which will be described below. In the external-connection-terminal mount surface, the external-connection-terminal mount area may be provided in such a way as to seal the vent, or arranged in a pattern in which a wiring line is provided from the vent to the external-connection-terminal mount area.

The core substrate of the wiring board 8 only needs to be an insulative material. An exemplary core substrate is a glass fiber impregnated with epoxy resin. Note that, although a majority of the thickness of the core substrate is 0.2 mm or below, the thickness is not limited to this value. Further, exemplary core substrates of the wiring board 8 include polyimide, a substrate made of glass cloths impregnated with epoxy resin, and a substrate made of aramid resin. In the present embodiment, the wiring board 8 is a copper-clad wiring board in which a copper foil (wiring pattern made of a copper foil) is adhered to both surfaces of the core substrate.

As described above, in the present embodiment, the vent is formed in order to allow the upper surface and the lower surface of the wiring board 8 to be electrically connected. This vent is formed under the signal wiring pattern 4, which is a metal land section where the vent is to be provided. The vent is formed by use of a drill or a laser. An exemplary diameter of the vent is 0.2 mm or below, but the diameter is not limited to this value. An inner surface of the vent is plated with copper so that the wiring patterns, each of which is made of a copper foil, of the upper and lower surfaces of the wiring board 8 are electrically connected to each other.

The following describes how the wiring pattern is formed. First, a copper foil is adhered to both of the surfaces. Then, a dry film for patterning is adhered to the copper foil adhered to the surfaces of the wiring board 8 having the vent as described above. Thereafter, a mask pattern is aligned with the core substrate and then exposed. Then, a pattern of the dry film is formed by etching. Thereafter, the copper foil on the upper and lower surfaces of the wiring board 8 is processed by etching on the basis of the pattern of the dry film, thereby forming the wiring pattern.

The foregoing describes a method for forming the pattern by using a subtractive process, in which method the wiring pattern, including the signal wiring patterns 3, 4, and 5 and the dummy wiring 6, is formed by etching the copper foil. The method for forming a wiring pattern, including the signal wiring patterns 3, 4, and 5 and the dummy wiring 6, however, is not limited to this method. For example, the wiring pattern may be formed by using an additive process (or semi-additive process). Specifically, the vent is formed through a substrate having a thin copper-foil layer retained on its upper and lower surfaces, or in a substrate having no copper foil. Then, the vent is plated with copper so that the signal wiring patterns and the inner part of the vent are electrically connected.

A majority of the thickness of the signal wiring patterns 3, 4, and 5 and the dummy wiring 6 is in the range of approximately 10 µm to 20 µm. Depending upon the density of the signal wiring patterns 3, 4, and 5 and the dummy wiring 6, however, the thickness may become thinner or thicker.

The dummy wiring 6 is provided in an area excluding an area of the wirings (signal wiring patterns 3, 4, 5) that are actually used in the device. Concretely, in the present embodiment, the dummy wiring 6 is arranged in a manner such that a wiring line and a space are alternately formed and extend from the central part of the semiconductor-chip mount area 2 to or toward four edges of the wiring board 8, as shown in FIG. 1. The dummy wiring 6 is arranged in a manner such that it is not closed under the semiconductor chip 1. The dummy wiring 6 is arranged in a manner such that constant lines are formed at a same wiring width and a same wiring space, i.e. a same density, as those of the signal wirings (signal wiring pattern 3) used in the actual device. Accordingly, the dummy wiring 6 is arranged in a manner such that moisture does not accumulate in a particular area under the semiconductor chip 1 when the semiconductor chip 1 is mounted on the wiring board 8. Furthermore, there is no area where the semiconductor chip 1 and the wiring board 8 are adhered to each other too strongly. Therefore, moisture spreads evenly in the semiconductor-chip mount area 2. This makes it possible to scatter power generated when moisture vaporizes and expands due to heat applied in order to mount the solder ball or to mount the semiconductor apparatus on the mount board. Therefore, expansion in the semiconductor apparatus is prevented. This will be described below.

As the foregoing describes, the dummy wiring 6 formed in the semiconductor-chip mount area 2 in the wiring board 8 is arranged in a manner such that all wiring-lines included in the dummy wiring 6 each have a free end. Therefore, no closed area is formed under the semiconductor chip 1 when the semiconductor chip 1 is mounted. If there were a closed area, moisture would accumulate. In this case, however, there is no closed area. Therefore, no concentrated accumulation of moisture occurs between the semiconductor chip 1 and the wiring board 8. Because no moisture has accumulated, even when heat is applied, a defect due to expansion of moisture is prevented in the semiconductor apparatus. Even if moisture has accumulated, the moisture is expelled when heat is applied, and therefore the defect is prevented. Concretely, change in an outer shape of the semiconductor apparatus is prevented, which change would have caused the semiconductor apparatus to become a defective and/or become no longer attachable, and/or a wiring inside to be disconnected. By forming the dummy wiring 6 arranged in the manner described above, the defect due to expansion of moisture is prevented in the semiconductor apparatus, with a simple structure and without raising costs. Note that, in the present embodiment, all wiring-lines included in the dummy wiring 6 each have a free end within the semiconductor-chip mount area 2. This more assuredly prevents the defect due to expansion of moisture.

Accordingly, by employing the wiring board 8 described above, reliable and high-quality semiconductor apparatuses are produced.

Further, in the case where (a part of) the signal wiring pattern 3 is formed in the semiconductor-chip mount area 2, and there is the signal wiring pattern 4, which is the metal land section where the vent is to be provided to allow the upper and the lower surfaces to be electrically connected to each other, it is preferable that the signal wiring pattern 4 in the semiconductor-chip mount area 2 be arranged evenly. By providing the dummy wiring 6 in the area other than the area of the signal wiring pattern 4, which is the metal land section, the expansion caused by heat is prevented more strongly.

In the case where none of the signal wiring patterns 3 and 4, which are wirings actually used in the device, is formed in the semiconductor-chip mount area 2, it is preferable that the dummy wiring 6 be provided in such a way as to extend from the central part of the semiconductor-chip mount area 2 to or toward the four edges of the wiring board 8.

Note that, it is possible to increase paths for allowing moisture generated owing to applied heat to escape, by providing the dummy wiring 6 next to the signal wiring pattern 4, which is the metal land section. This prevents expansion due to applied heat. Accordingly, an advantage is produced that the defect due to applied heat is prevented more assuredly.

Note that, although the wiring pattern is formed on both surfaces of the wiring board 8 described above, the wiring pattern may be formed only on the semiconductor mount surface. In this case, the metal land section provided in the form of a wiring pattern on the semiconductor mount surface may be connected to the external connection terminal through the vent provided under the metal land section.

Figure 2:
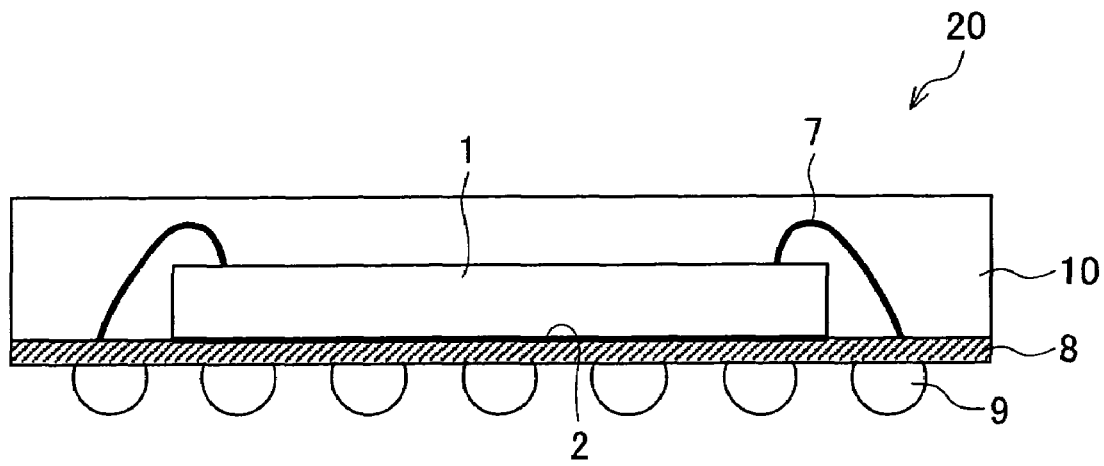
FIG. 2 is a cross section of a semiconductor apparatus.
Figure 3:
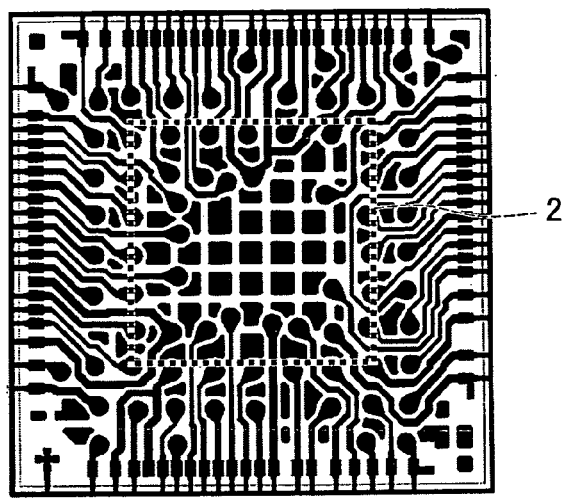
FIGS. 3(a), 3(b), and 3(c) are plan views each showing a wiring board employed in the present example.
Figure 3:
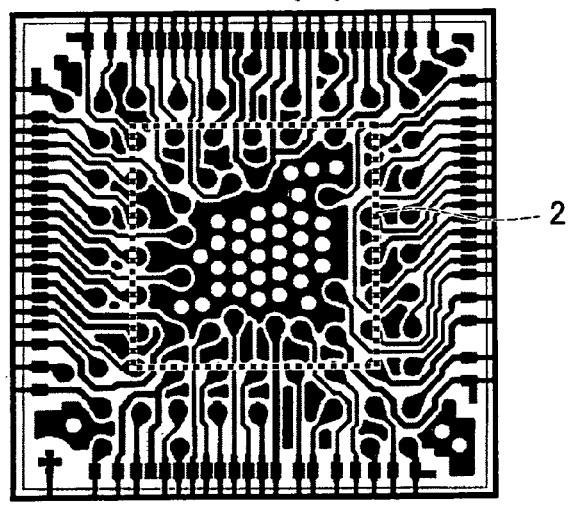
Figure 3:
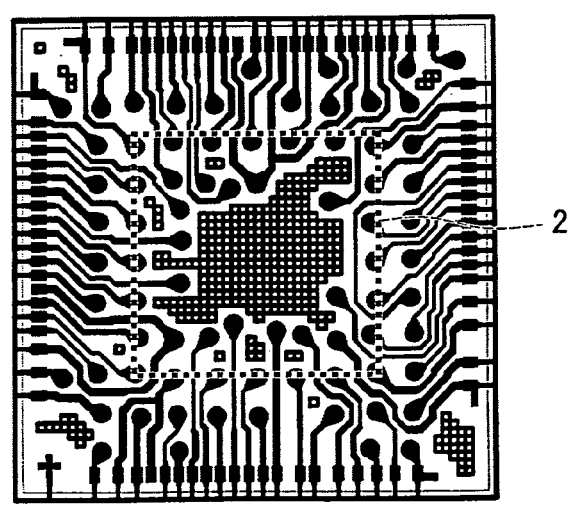

The following describes a method for producing a semiconductor apparatus 20 in the shape of the package as shown in FIG. 2, using the wiring board 8 described above. Note that, although the BGA type semiconductor apparatus 20 in the shape of package as shown in FIG. 2 is described in the present embodiment, the semiconductor apparatus may be in any other shape, as long as the external connection terminal can be mounted on a surface of the wiring board 8, which surface is opposite to the surface including the semiconductor-chip mount area 2.

After the wiring board 8 is formed in the manner described above, solder resist is applied to the signal wiring patterns on the upper and lower surfaces, excluding the signal wiring pattern 5, which is the connection section for wire bonding, and the metal land section for the external connection terminal, which metal land section is provided on the surface of the wiring board 8, which surface is opposite to the semiconductor-chip mount surface. The solder resist may be applied by using a screen printing process or a roll coating process.

Then, the semiconductor chip 1 with a sheet adhesive is mounted on the semiconductor-chip mount area 2 of the wiring board 8. The sheet adhesive is adhered in advance to a surface of the semiconductor chip 1, which surface is opposite to the surface on which a circuit is formed. The thickness of the semiconductor chip 1 is not particularly limited. An exemplary thickness is 0.33 mm. Further, a pad section provided at the surface of the semiconductor chip 1, on which surface the circuit is formed, and the signal wiring pattern 5, which is a terminal section for wire bonding, of the wiring board 8 are connected through a thin metal wire (wire) 7. To protect the semiconductor chip 1 and the thin metal wire 7, the wiring board 8 is sealed with a resin 10 by a transfer molding method, for example. Then, flux is applied to the signal wiring pattern that is the metal land section for the external connection terminal and is formed on a surface opposite to the semiconductor-chip mount surface of the wiring board 8 thus sealed with resin. Thereafter, solder balls are mounted on signal wiring patterns that are metal land sections for the external connection terminal, respectively. Then, the solder balls and the semiconductor apparatus are heated in a reflow oven so that the solder balls are melted and fixed, thereby forming the external connection terminal 9. A lead-free solder ball is employed as the solder ball. The solder ball is not limited to the lead-free solder ball. Then, dicing is performed. Finally, assembly of the semiconductor apparatus is completed.

In the semiconductor apparatus 20, either no moisture accumulates under the semiconductor chip 1, or moisture is expelled, when heat is applied in order to form the external connection terminal 9 or to mount the semiconductor apparatus on the mount board. This makes it possible to prevent the defect due to expansion of moisture in the semiconductor apparatus. Because the lead-free solder is higher in melting point than a eutectic solder, it is necessary to set a higher temperature to connect the lead-free solder than to connect the eutectic solder. No defect due to expansion of moisture, however, is produced in the semiconductor apparatus. This makes the semiconductor apparatus reliable and high quality.

Example

The wiring board 8, described in the above embodiment, that has the dummy wiring 6 arranged as shown in FIG. 1 was produced and verified.

To confirm advantages of the wiring board 8 including the dummy wiring 6 arranged as shown in FIG. 1, the wiring board 8 was compared with wiring boards each having a dummy wiring of different shape. FIGS. 3(a) to 3(c) each show a wiring board having a different dummy wiring. The wiring board shown in FIG. 3(a) has a dummy wiring of block pattern in the semiconductor-chip mount area 2. The wiring board shown in FIG. 3(b) has, in the semiconductor-chip mount area 2, a dummy wiring that is a solid wiring with circular holes inside. The wiring board shown in FIG. 3(c) has a dummy wiring of lattice pattern (mesh) in the semiconductor-chip mount area 2.

In other words, the wiring boards shown in FIGS. 3(b) and 3(c) each have a dummy wiring whose pattern is closed under a semiconductor chip when the semiconductor chip is mounted.

The wiring boards were produced in a manner such that dummy wirings shown in FIGS. 1 and 3(a) to 3(c) were provided in areas other than those having actual signal wiring patterns (wiring pattern that allows signals to pass therethrough), respectively. Note that, in the present example, all wiring boards were produced under the same conditions. In the present example, a core substrate of 0.06 mm was employed as the core substrate of the wiring boards. The signal wiring pattern and the dummy wiring were produced by use of a subtractive process in a manner such that each of the signal wiring patterns and the dummy wiring had a thickness of approximately 15 μm. The vent for electrical conduction was made by drilling in such a way as to have the diameter of 0.1 mm. The dummy wiring shown in FIG. 1 has a wiring width of 50 μm and a space of 50 μm between wirings.

Then, the semiconductor apparatus in the shape of package as shown in FIG. 2 was assembled with the use of the respective wiring boards formed in the manner described above. Note that, in the present example, solder resist was applied by using a screen printing process in assembly of the semiconductor apparatus. Further, a semiconductor chip 1 having a thickness of 0.33 mm was used. A thin gold wire having a diameter of 25 μm was used as the thin metal wire 7. Epoxy resin was used as the sealing resin 10. A lead-free solder ball was used as a solder ball that was the external connection terminal 9. All semiconductor apparatuses were assembled under the same conditions, although different wiring boards were used.

The semiconductor apparatuses thus assembled were kept under a condition of high temperature and high moisture, and then heated in a reflow oven. In the present example, the semiconductor apparatuses were heated at 260 degrees to 300 degrees at the maximum. The foregoing steps were performed repeatedly. The semiconductor apparatuses including the wiring boards each having a different dummy wiring were compared in view of superiority. Note that the semiconductor apparatuses were kept and heated under the same conditions, and performance of the steps was repeated for a same number of times (however, after a defect had been produced in a semiconductor apparatus, no more step was performed on the semiconductor apparatus). As a result, even after the heating in the reflow was performed for three times, no defect was produced in the semiconductor apparatus including the wiring board having the dummy wiring shown in FIG. 1. Specifically, no expansion of moisture absorbed inside the semiconductor apparatus occurred, and therefore no change in an outer shape of the semiconductor apparatus occurred, which change would have caused the semiconductor apparatus to become a defective and/or become no longer attachable, and/ or a wiring inside to be disconnected.

On the contrary, some sort of defects were observed in the semiconductor apparatuses each including the wiring board having a dummy wiring of a different pattern. However, the defect was relatively small in the semiconductor apparatus including the wiring board having the dummy wiring shown in FIG. 3(a), compared to those in the semiconductor apparatus including the wiring board having the dummy wiring shown in FIG. 3(b) and the semiconductor apparatus including the wiring board having the dummy wiring shown in FIG. 3(c).

Note that each of the wiring board having the dummy wiring shown in FIG. 1 and the wiring board having the dummy wiring shown in FIG. 3(a) is arranged in a manner such that all wiring-lines included in the respective dummy wirings each have a free end. In other words, the dummy wiring has a pattern that would not be closed under a semiconductor chip when the semiconductor chip is mounted. On the other hand, in the wiring boards of FIGS. 3(b) and 3(c), each dummy wiring has a pattern that would be closed under a semiconductor chip when the semiconductor chip is mounted. The foregoing implies that, if there is provided a dummy wiring arranged in a manner such that all wiring-lines included in the dummy wiring each have a free end, either no defect due to expansion of moisture absorbed inside the semiconductor apparatus is produced, or the defect is diminished. More specifically, it implies that the following defects due to change in an outer shape of the semiconductor apparatus, which change would have occurred if the moisture were expanded, either are not produced or are diminished: the semiconductor apparatus becomes a defective; the semiconductor apparatus becomes no longer attachable; and/or a wiring inside becomes disconnected.

Further, the results of the steps of keeping and heating the semiconductor apparatus including the wiring board having the dummy wiring shown in FIG. 1 and the semiconductor apparatus including the wiring board having the dummy wiring shown in FIG. 3(a) imply that, if a proportion of an area occupied by the entire wirings including the dummy wiring and the signal wiring pattern and a proportion of an area of spaces between the wirings, in which area the entire wirings are not provided, are nearly the same in the semiconductor-chip mount area 2, then fewer defects are produced.

Figure 4:
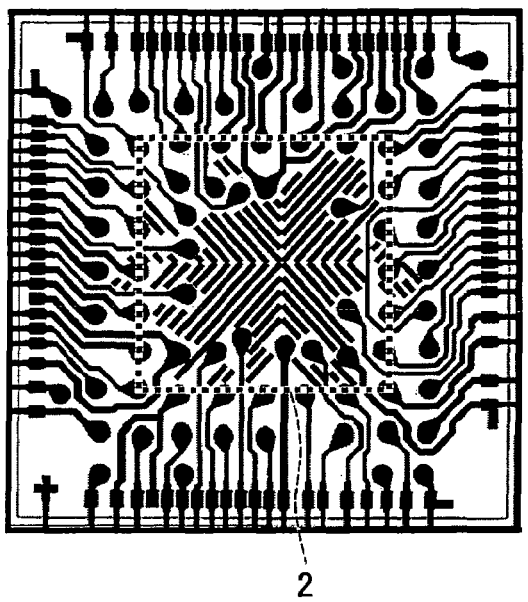
FIGS. 4(a), 4(b), 4(c), 4(d) are plan views of wiring boards.
Figure 4:
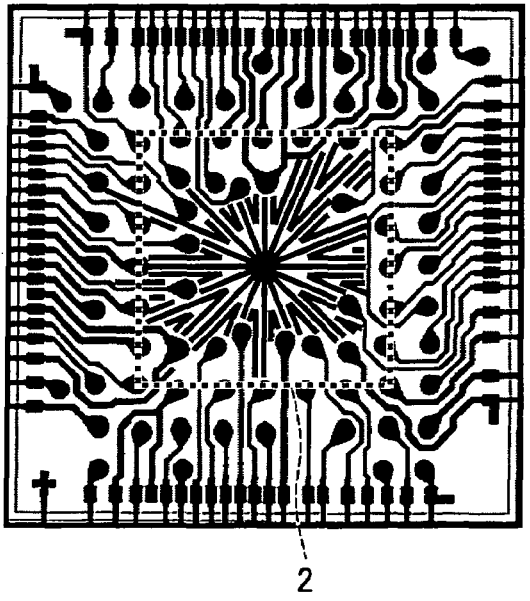
Figure 4:
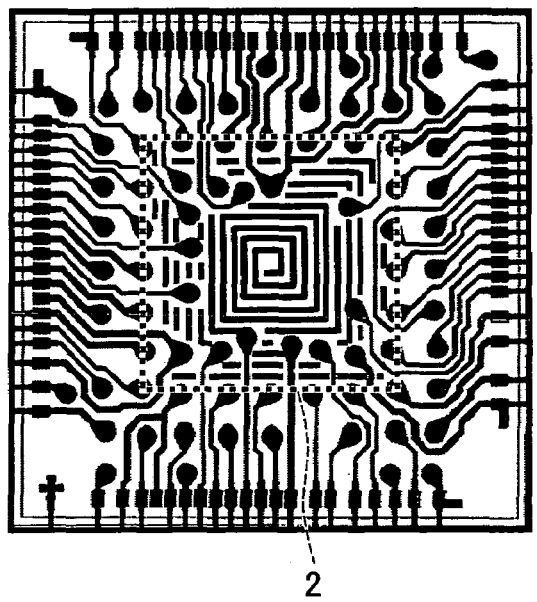
Figure 4:
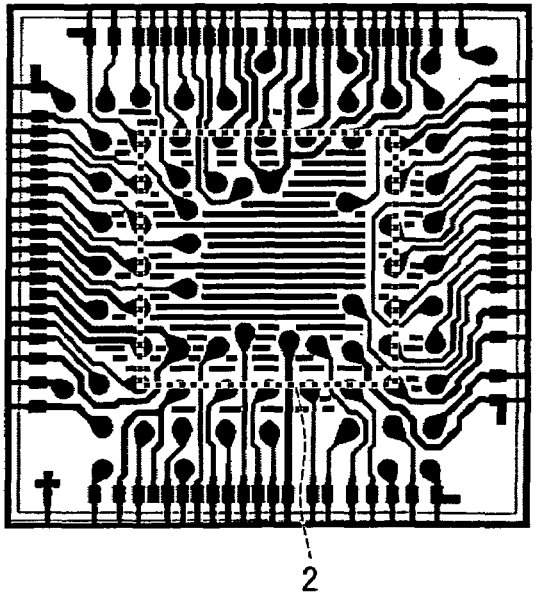
Figure 5:
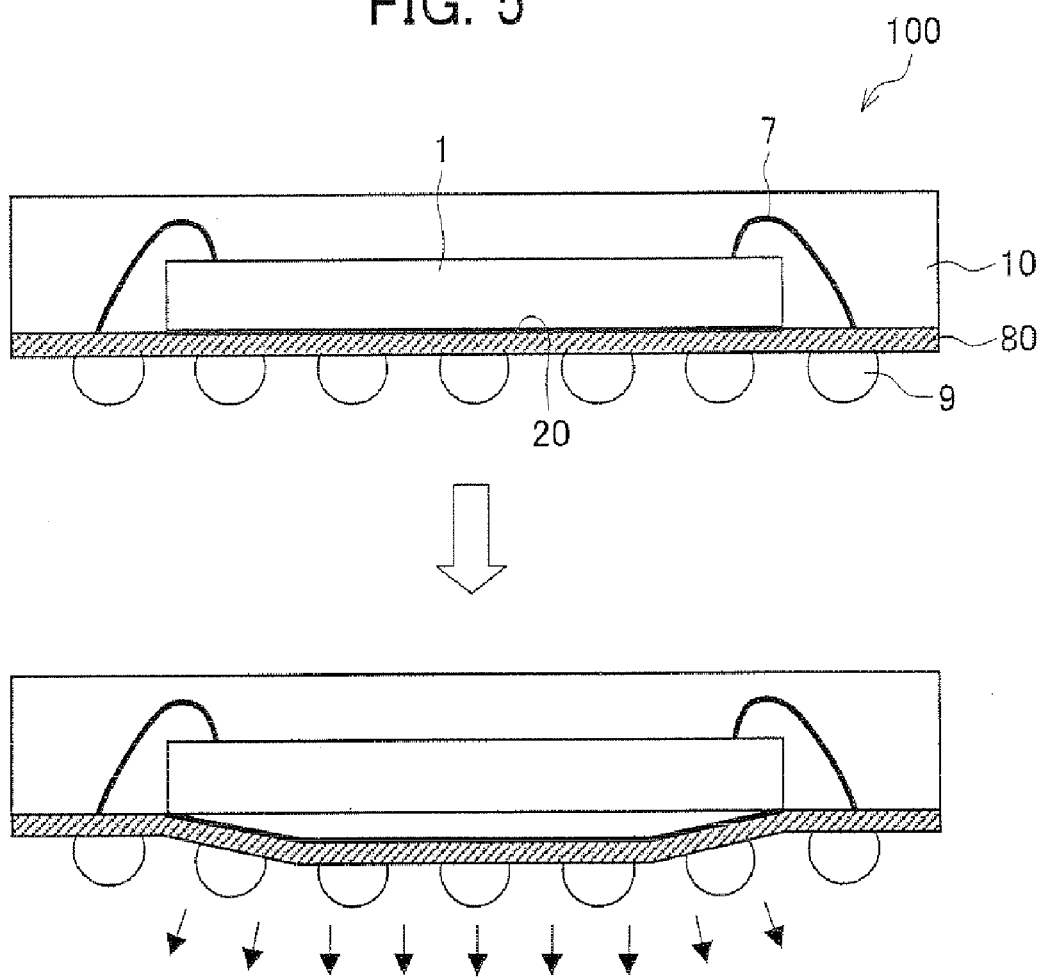
FIG. 5 is a cross section of a conventional semiconductor apparatus, for explaining a defect in the apparatus.
Figure 6:
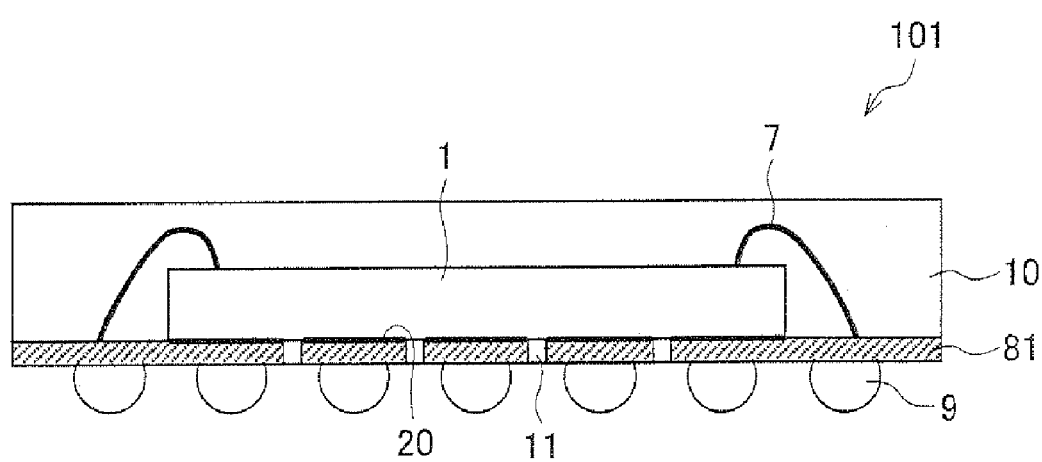
FIG. 6 is a cross section of a conventional semiconductor apparatus having vents for allowing the air to be released.

FIG. 4 shows another wiring board that produces the same advantages as those produced by the wiring board 8 having the dummy wiring shown in FIG. 1. In other words, no defect is produced in the wiring board shown in FIG. 4. The wiring board shown in FIG. 4(a) has, in the semiconductor-chip mount area 2, a dummy wiring arranged in a combination of shapes of X and Y. The wiring board shown in FIG. 4(b) has, in the semiconductor-chip mount area 2, a dummy wiring extending in all directions. Each of the dummy wirings shown in FIGS. 4(a) and 4(b), respectively, is arranged in a manner such that constant lines are formed from a central part of the semiconductor-chip mount area 2 to or toward an upper left corner, a lower left corner, an upper right corner, and a lower right corner. The lines are formed at a same wiring width and a same wiring space, i.e. a same wiring density, as those of the signal wirings used in the actual device. The wiring board shown in FIG. 4(c) has, in the semiconductor-chip mount area 2, a dummy wiring having a pattern of coil. The wiring board shown in FIG. 4(d) has, in the semiconductor-chip mount area 2, a dummy wiring having a pattern of stripes lined in a same direction. It should be noted that the above dummy wirings are merely examples. As long as a wiring board includes the dummy wiring 6 arranged in a manner such that all wiring-lines included in the dummy wiring 6 each have a free end in the semiconductor-chip mount area, the wiring board produces same advantages as the above-described advantages produced by the wiring board including the dummy wiring arranged as shown in FIG. 1.

To achieve the object, a wiring board is adapted so that the wiring board has a first surface including a semiconductor-chip mount area on which a semiconductor chip is to be mounted and a second surface, opposite to the first surface, to which an external connection terminal is to be provided, and includes a dummy wiring, in the semiconductor-chip mount area, arranged in a manner such that a wiring line included in the dummy wiring has a free end within the semiconductor-chip mount area.

Further, in addition to the above structure, the dummy wiring in the wiring board is provided in a manner such that a wiring width and a wiring space are constant.

In the above arrangement, the dummy wiring in the semiconductor-chip mount area is arranged in a manner such that the width of the wiring line and the space between wiring lines are equal. In the semiconductor-chip mount area, the dummy wiring is formed in a manner such that the width of the wiring line and the space between wiring lines are equal, thereby avoiding a pattern of large area being provided. This allows the dummy wiring and the semiconductor chip to be adhered evenly when the semiconductor chip is mounted. If there is a large pattern, the large pattern is adhered more strongly. This causes the large pattern to become unbalanced with other areas. In this case, expansion of the board tends to occur easily in the other areas. On the contrary, the above structure allows the dummy wiring to adhere evenly to the semiconductor chip. Therefore, stable semiconductor apparatuses are produced.

Further, in addition to the above structure, the dummy wiring in the wiring board may be arranged in such a way as to extend from at least a point in the semiconductor-chip mount area to or toward an outside of the semiconductor-chip mount area.

In the above arrangement, the dummy wiring is arranged in such a way as to extend from at least a point in the semiconductor-chip mount area to or toward the outside of the semiconductor-chip mount area. Therefore, in the semiconductor-chip mount area, the dummy wiring is arranged in a manner such that the semiconductor chip and the board are not adhered to each other too strongly, and moisture spreads evenly under the semiconductor chip without concentrating on one spot.

Further, in addition to the above structure, a ratio of a first area occupied by an entire wiring including the dummy wiring with respect to a second area not occupied by the entire wiring, which second area is constituted of space between wiring lines, may be in a range of 40:60 to 60:40 in the semiconductor-chip mount area of the wiring board.

In the above arrangement, the ratio of the first area occupied by the entire wiring with respect to the second area of the space between the wiring lines is in the range of 40:60 to 60:40 in the semiconductor-chip mount area. In other words, respective proportions of the areas are substantially equal. The area with the wiring and the area without the wiring are formed equally in the semiconductor-chip mount area so that the semiconductor chip and the wiring are adhered to each other evenly and not too strongly.

Note that, in the case where there is no signal wiring (wiring through which signals are actually transmitted) in the semiconductor-chip mount area, the ratio of the first area occupied by the entire wiring with respect to the second area of the space between wiring lines is the ratio of an area occupied solely by the dummy wiring with respect to an area of space between wiring lines, in which area no dummy wiring is provided.

Further, as described above, in a semiconductor apparatus, a semiconductor chip is mounted on a mount area of one of the above wiring boards, and an external connection terminal is formed on an opposite surface to a surface of the wiring board, which surface includes the mount area.

In the above arrangement, the semiconductor apparatus is produced with the use of the wiring board including, in the semiconductor-chip mount area, the dummy wiring arranged in a manner such that all wiring-lines included in the dummy wiring each have a free end. Therefore, when heat is applied so as to form the external terminal and to mount the semiconductor apparatus on the mount board, either no moisture has been accumulated under the semiconductor chip, or moisture is expelled. Thus, the defect due to expansion of moisture inside is prevented in the semiconductor apparatus. Concretely, change in an outer shape of the semiconductor apparatus is prevented, which change would have caused the semiconductor apparatus to become a defective and/or become no longer attachable, and disconnection of a wiring inside is prevented. Furthermore, even when the temperature is set higher in connecting a lead-free solder employed as an external connection terminal than in connecting a eutectic solder, no defect due to expansion of moisture is produced in the semiconductor apparatus. Accordingly, reliable and high-quality semiconductor apparatuses are provided.

The wiring board may be defined as a wiring board having the following structure. The wiring board for semiconductor packages includes at least one area, on its upper surface, on which a semiconductor chip is to be mounted, and a connection electrode for connection in wire bonding. The wiring board includes, on its lower surface, a land for an external connection terminal. When the semiconductor chip is mounted, wiring excluding signal wiring, which wiring comes under the section on which the semiconductor chip is mounted, is not closed under the semiconductor chip.

Further, the wiring board may also be defined by the following description. In the wiring board, the wiring excluding the signal wiring in the semiconductor-chip mount area extends, to or toward the outside of the semiconductor chip, from at least one point, or a plurality of points, under the section on which the semiconductor chip is mounted.

Further, the wiring board may also be defined by the following description. In the wiring board, a ratio of occupancy of the wiring excluding the signal wiring and the space between wiring lines is in the range of 40:60 to 60:40 in the semiconductor-chip mount area.

Further, the semiconductor apparatus may be defined as the semiconductor package described below. In the semiconductor package, a semiconductor chip is mounted on an upper surface of any one of the above wiring boards. The semiconductor chip and the wiring board are electrically connected via a conductive thin wire. The semiconductor chip and the conductive thin wire are sealed by a resin in such a way as to be covered by the resin. An external connection terminal is formed on a lower surface of the wiring board.

The embodiments and concrete examples of implementation discussed in the foregoing detailed explanation serve solely to illustrate the technical details of the technology, which should not be narrowly interpreted within the limits of such embodiments and concrete examples, but rather may be applied in many variations within the spirit of the present technology, provided such variations do not exceed the scope of the patent claims set forth below.

The present technology is applicable to semiconductor apparatuses to be mounted on or built in electronics devices and the like. The present technology is useful especially for thinned semiconductor apparatuses, and semiconductor apparatuses using a lead-free solder as an external terminal in view of environment protection.

The invention claimed is:

1. A wiring board, comprising:
    a first surface including a semiconductor-chip mount area on which a semiconductor-chip is to be mounted; and
    a second surface, opposite to the first surface, to which an external connection terminal is to be provided; and
    a dummy wiring pattern comprising a plurality of dummy wiring lines located in the semiconductor-chip mount area, wherein a width of the dummy wiring lines is approximately constant along their length, wherein the width of the dummy wiring lines is approximately equal to a width of free spaces between the dummy wiring lines, wherein the dummy wiring lines are arranged such that at least one free space between adjacent dummy wiring lines extends from a location adjacent an edge of the semiconductor chip mount area to a central portion of the semiconductor chip mount area, wherein the dummy wiring lines of the dummy wiring pattern are arranged in four quadrants, wherein within each quadrant, all the dummy wiring lines extend parallel to one another, and wherein the dummy wiring lines in each quadrant extend in a direction that is perpendicular to the dummy wiring lines in both adjacent quadrants.

2. The board according to claim 1, wherein the dummy wiring lines are arranged in such a way as to extend from the central portion of the semiconductor-chip mount area to or toward an outside of the semiconductor-chip mount area.

3. The board according to claim 1, wherein, in the semiconductor-chip mount area, a ratio of a first area occupied by an entire wiring including the dummy wiring pattern with respect to a second area not occupied by the entire wiring, which second area is constituted of space between wiring lines, is in a range of 40:60 to 60:40.

4. The wiring board of claim 1, wherein wiring patterns are formed on the first surface of the wiring board, wherein external connection terminal pads are formed on the second surface of the wiring board, and wherein the external connection terminal pads are electrically coupled to respective ones of the wiring patterns by conductive paths that extend through the wiring board.

5. The wiring board of claim 1, wherein the wiring lines in diagonally opposite quadrants extend in directions that are parallel to one another.

6. A wiring board, comprising:
    a first surface including a semiconductor-chip mount area on which a semiconductor-chip is to be mounted;
    a second surface, opposite to the first surface, to which an external connection terminal is to be provided; and
    a dummy wiring pattern provided in the semiconductor-chip mount area, the dummy wiring pattern comprising a plurality of dummy wiring lines having a substantially uniform width along their length and free spaces between the dummy wiring lines, wherein the dummy wiring lines are arranged in a manner such that, when a semiconductor-chip is mounted, all of the free spaces between the dummy wiring lines remain open at side edges of the semiconductor-chip, wherein a width of the dummy wiring lines is approximately equal to a width of the free spaces between the dummy wiring lines, wherein the dummy wiring lines of the dummy wiring pattern are arranged in four quadrants, wherein the dummy wiring lines in each quadrant extend in a direction that is perpendicular to the dummy wiring lines in both adjacent quadrants, and wherein all of the dummy wiring lines within each quadrant extend parallel to one another.

7. The wiring board of claim 6, wherein wiring patterns are formed on the first surface of the wiring board, wherein external connection terminal pads are formed on the second surface of the wiring board, and wherein the external connection terminal pads are electrically coupled to respective ones of the wiring patterns by conductive paths that extend through the wiring board.

8. A semiconductor apparatus, comprising:
    a wiring board having a first surface including a semiconductor-chip mount area on which a semiconductor-chip is mounted and a second surface, opposite to the first surface, the wiring board comprising a dummy wiring pattern located in the semiconductor-chip mount area and comprising a plurality of dummy wiring lines, wherein a width of the dummy wiring lines is substantially uniform along their length, wherein the width of the dummy wiring lines is approximately equal to a width of free spaces between the dummy wiring lines, wherein the dummy wiring lines are arranged such that at least one free space between adjacent dummy wiring lines extends from a location adjacent an edge of the semiconductor chip mount area to a central portion of the semiconductor chip mount area, wherein the dummy wiring lines of the dummy wiring pattern are arranged in four quadrants, wherein the dummy wiring lines in each quadrant extend in a direction that is perpendicular to the dummy wiring lines in both adjacent quadrants, and wherein all the dummy wiring lines within a quadrant extend parallel to one another;
    a semiconductor-chip having a first surface that is attached to the semiconductor-chip mount area on the first surface of the wiring board by an adhesive layer interposed between the wiring board and the chip; and
    bonding wires coupling bond pads on a second surface of the semiconductor-chip opposite the first surface to wiring patterns formed on the first surface of the wiring board.

* * * * *